US009236874B1

(12) United States Patent
Rossum

(10) Patent No.: US 9,236,874 B1
(45) Date of Patent: Jan. 12, 2016

(54) REDUCING DATA TRANSITION RATES BETWEEN ANALOG AND DIGITAL CHIPS

(71) Applicant: Audience, Inc., Mountain View, CA (US)

(72) Inventor: David P. Rossum, Santa Cruz, CA (US)

(73) Assignee: Audience, Inc., Mountain View, CA (US)

( * ) Notice: Subject to any disclaimer, the term of this patent is extended or adjusted under 35 U.S.C. 154(b) by 0 days.

(21) Appl. No.: 14/336,934

(22) Filed: Jul. 21, 2014

Related U.S. Application Data

(60) Provisional application No. 61/856,528, filed on Jul. 19, 2013.

(51) Int. Cl.
*H03M 5/06* (2006.01)
*H03M 1/00* (2006.01)
*H03M 5/00* (2006.01)
*H03M 9/00* (2006.01)

(52) U.S. Cl.
CPC ............. *H03M 1/002* (2013.01); *H03M 5/00* (2013.01); *H03M 9/00* (2013.01)

(58) Field of Classification Search
CPC ....... H03M 7/40; H03M 7/06; H03M 7/3086; H03M 5/16; H03M 9/00; H03M 5/00; H03M 1/002

USPC ..................................................... 341/55–70
See application file for complete search history.

(56) References Cited

U.S. PATENT DOCUMENTS

| 5,177,482 | A | * | 1/1993 | Cideciyan et al. ............. 341/59 |
| 5,216,423 | A | * | 6/1993 | Mukherjee ..................... 341/79 |
| 5,633,631 | A | * | 5/1997 | Teckman ....................... 341/58 |
| 6,188,797 | B1 | * | 2/2001 | Moledina et al. .............. 341/67 |
| 6,456,209 | B1 | * | 9/2002 | Savari ........................... 341/67 |
| 6,516,136 | B1 | * | 2/2003 | Lee ............................... 386/353 |
| 2003/0038736 | A1 | * | 2/2003 | Becker et al. .................. 341/60 |

* cited by examiner

*Primary Examiner* — Lam T Mai
(74) *Attorney, Agent, or Firm* — Carr & Ferrell LLP

(57) ABSTRACT

Provided are methods and systems for reducing a transition rate in transmitting data between analog and digital chips in Sigma-Delta Modulator (SDM) based Digital to Analog Converters (DACs) and Analog to Digital Converters (ADCs) intended to be used in audio signal processing. An example method may comprise receiving, by a digital chip, SDM binary data, mapping the SDM binary data to transition binary codes, and transmitting the transition binary codes to an analog chip. The mapping can be carried out according to a principle that the more commonly used SDM binary data codes correspond to transition binary data codes that require that fewer transitions occur in the signals between the chips. The methods and systems described provide for lowering the power needed for carrying out the data transmission between digital and analog chips.

21 Claims, 11 Drawing Sheets

| SDM Data In order of likelihood | Corresponding Transition Code | # of Transitions |
|---|---|---|
| 0 | 00000 | 0 |
| +1 | 00001 | 1 |
| -1 | 10000 | 1 |
| +2 | 00011 | 1 |
| -2 | 11000 | 1 |
| +3 | 00111 | 1 |
| -3 | 11100 | 1 |
| +4 | 01111 | 1 |
| -4 | 11110 | 1 |
| +5 | 00110 | 2 |
| -5 | 01110 | 2 |
| +6 | 00010 | 2 |
| -6 | 01100 | 2 |
| +7 | 00100 | 2 |
| -7 | 01000 | 2 |
| +8 | 11001 | 2 |
| -8 | 10001 | 2 |
| +9 | 11101 | 2 |
| -9 | 10011 | 2 |
| +10 | 11011 | 2 |
| -10 | 10111 | 2 |
| +11 | 10010 | 3 |
| -11 | 10100 | 3 |
| +12 | 10110 | 3 |
| -12 | 11010 | 3 |
| +13 | 01001 | 3 |
| -13 | 01010 | 3 |
| +14 | 01101 | 3 |
| -14 | 00101 | 3 |
| +15 | 10101 | 4 |
| -15 | 10101 | 4 |
| Unused | 11111 | 0 |

FIG. 2A

| SDM Data In order of | Corresponding Transition Code | Transmitted NRZI Streams | | # of Transitions |
|---|---|---|---|---|
| 0 | 00000 | 0 00000 | 1 11111 | 0 |
| +1 | 00001 | 0 00001 | 1 11110 | 1 |
| -1 | 00010 | 0 00011 | 1 11100 | 1 |
| +2 | 00100 | 0 00111 | 1 11000 | 1 |
| -2 | 01000 | 0 01111 | 1 10000 | 1 |
| +3 | 10000 | 0 11111 | 1 00000 | 1 |
| -3 | 00011 | 0 00010 | 1 11101 | 2 |
| +4 | 00101 | 0 00110 | 1 11001 | 2 |
| -4 | 01001 | 0 01110 | 1 10001 | 2 |
| +5 | 10001 | 0 11110 | 1 00001 | 2 |
| -5 | 00110 | 0 00100 | 1 11011 | 2 |
| +6 | 01010 | 0 01100 | 1 10011 | 2 |
| -6 | 10010 | 0 11100 | 1 00011 | 2 |
| +7 | 01100 | 0 01000 | 1 10111 | 2 |
| -7 | 10100 | 0 11000 | 1 00111 | 2 |
| +8 | 11000 | 0 10000 | 1 01111 | 2 |
| -8 | 00111 | 0 00101 | 1 11010 | 3 |
| +9 | 01011 | 0 01101 | 1 10010 | 3 |
| -9 | 10011 | 0 11101 | 1 00010 | 3 |
| +10 | 01101 | 0 01001 | 1 10110 | 3 |
| -10 | 10101 | 0 11001 | 1 00110 | 3 |
| +11 | 11001 | 0 10001 | 1 01110 | 3 |
| -11 | 01110 | 0 01011 | 1 10100 | 3 |
| +12 | 10110 | 0 11011 | 1 00100 | 3 |
| -12 | 11010 | 0 10011 | 1 01100 | 3 |
| +13 | 11100 | 0 10111 | 1 01000 | 3 |
| -13 | 01111 | 0 01010 | 1 10101 | 4 |
| +14 | 10111 | 0 11010 | 1 00101 | 4 |
| -14 | 11011 | 0 10010 | 1 01101 | 4 |
| +15 | 11101 | 0 10110 | 1 01001 | 4 |
| -15 | 11110 | 0 10100 | 1 01011 | 4 |
| Unused | 11111 | 0 10101 | 1 01010 | 5 |

FIG. 2B

REDUCING DATA TRANSITION RATES BETWEEN ANALOG AND DIGITAL CHIPS

CROSS-REFERENCE TO RELATED APPLICATION

The present application claims the benefit of U.S. Provisional Application No. 61/856,528, filed on Jul. 19, 2013. The subject matter of the aforementioned application is incorporated herein by reference for all purposes.

TECHNICAL FIELD

This disclosure relates generally to data processing in audio signal systems, and more specifically, to methods and systems for reducing data transition rates between analog and digital chips.

BACKGROUND

The approaches described in this section could be pursued but are not necessarily approaches that have been previously conceived or pursued. Therefore, unless otherwise indicated, it should not be assumed that any of the approaches described in this section qualify as prior art merely by virtue of their inclusion in this section.

Sigma-Delta Modulator (SDM) based Digital-to-Analog converters (DACs) and Analog-to-Digital Converters (ADCs) are commonly used mixed signal (i.e., containing both analog and digital portions) circuits important to audio processing. Because analog circuits do not scale the same way as digital circuits with respect to the process technology, it may make sense implementing these circuits using two separate chips, with each taking advantage of its corresponding optimal process technology. The use of separate analog and digital chips may be done for other reasons as well.

The optimal interface between the analog and digital chips is at the output of the SDM, because this partitioning allows the digital chip to include the all-digital circuitry of the interpolating (in the DAC case) or decimation (in the ADC case) digital filters, while the analog circuitry is located entirely on the analog chip. Unfortunately, this means that the data rate for the interface is quite high, since the SDM output is at a highly oversampled rate.

Dynamic power consumption for binary digital signals in Complementary Metal-Oxide-Semiconductor (CMOS) circuits is linearly dependent on the capacitance of the signal nodes and linearly dependent on the transition rate of the nodes between the two voltages representing the two possible binary states, i.e. 0 and 1. When two chips are interconnected, the interconnection signals tend to have relatively high capacitances, and since the SDM data is highly oversampled, the transition rate is also high. Consequently, the interface can consume significant power. Therefore, it would be beneficial to minimize the transition rates at the interface nodes.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The techniques disclosed herein provide for reducing the transition rate of SDM audio signals. The rate reducing techniques can be applied to both multi-bit SDM data, commonly used in DACs, and one-bit SDM data, also known as Pulse-Density Modulation (PDM) data, commonly used in ADCs.

The techniques described in this disclosure may be performed on data in binary code consisting of 0 and 1 bits. The methods of current disclosure utilize the fact that, generally, the binary serial transmission of a 0 bit followed by a 1 bit, or a 1 bit followed by a 0 bit requires energy to charge or discharge the capacitance of the interconnection wiring from the voltage representing a 0 to the voltage representing a 1 or vice-versa, consuming more power, compared to transmitting two sequential 0 bits or two sequential 1 bits.

N-bit SDM data may be represented using $2^N$ possible binary codes. In some embodiments, N-bit SDM data can be considered as signed binary data with one code representing a zero value code and two sets of $2^{N-1}-1$ magnitude codes, one set representing positive and one set representing negative values.

In the case of N-bit SDM, the transition rate reducing encoding techniques may utilize the fact that a typical audio signal includes mostly low amplitude samples. Consequently, the SDM high value codes are less frequently used, and, conversely, the SDM low value codes have higher probability.

Therefore, if instead of using a traditional numeric coding such as two's complement or sign-magnitude, the codes for the most common values are chosen to result in substantially reduced (e.g., minimum) signal transitions when serially transmitted. With such reduced signal transitions, the dynamic interface power can be significantly reduced at the cost of a trivial amount of logic and power within the chips to implement the encoding.

In the case of single bit SDM (or PDM), the encoding may be simplified. Because the data is noise-shaped, for low level audio, if a given bit cell has a particular value (1 or 0), the probability of the next bit cell having the same value is approximately 75%. By simply complementing every other bit cell prior to serial transmission, this probability can be reduced to 25%, reducing the probability of a transition, and thus the power, by a factor of 3.

According to an aspect of the present disclosure, a method for reducing a transition rate in transmitting data between digital and analog chips is provided. An example method may commence with receiving the data from a data source on a first chip. In some embodiments the data may represent an audio data stream. In certain embodiments, the data includes sigma-delta modulator (SDM) data.

In various embodiments, the method may proceed with mapping the received data to a transition binary code. The transition binary code includes series of '0' and '1'. A number of transitions from '0' to '1' and from '1' to '0' in the transition binary code can depend on a probability of a value of the received data. For example, the transition binary code representing the data having a more probable value (more commonly used data) may include fewer transitions from '0' and '1' and from '1' to '0' than the transition binary code representing the data having a less probable value (less commonly used data). The method may further allow for transmitting the transition binary code from the first chip to a second chip. In certain embodiments, the transition binary code includes a non return to zero inverted (NRZI) format code, also referred to herein as a non-return-to-zero inverted format code.

In some embodiments, the method may allow for receiving the data by packets from multiple parallel channels. In such embodiments, the method includes serializing the packets to a serial data before mapping to the transition binary code and parallelizing (de-serializing) the transition binary code to further packets after transmitting to the second chip.

In some embodiments, the data received from a data source on the first chip can be pulse-density modulation binary data. The method may include applying a XOR filter to every other bit of the data while mapping the data to the transition binary code. The method may further include applying a XOR filter to every other bit of the transition binary code after transmitting the transition binary code to the second chip.

Also provided is a system for reducing a transition rate in transmitting data between digital and analog chips. An example system may include a first chip, a second chip, and an interface. The interface can be operable to receive the data from the first chip and map the received data to transition binary code. In some embodiments, the received data may represent an audio data stream. In certain embodiments, the received data is sigma-delta modulator binary data. The transition binary code includes series of '0' and '1', wherein a number of transitions from '0' to '1' and from '1' to '0' depends on a probability of a value of the data. For example, the transition binary code representing the data having a more probable value includes fewer transitions from '0' and '1' and from '1' to '0' than the transition binary code representing the data having a less probable value. The interface is further operable to (serially) transmit the transition binary code to the second chip. In some embodiments, the transition code includes non return to zero inverted (NRZI) format codes.

According to another example embodiment of the present disclosure, the steps of the method for reducing a transition rate in transmitting data between digital and analog chips are stored on a machine-readable medium comprising instructions, which when implemented by one or more processors perform the recited steps.

Other example embodiments of the disclosure and aspects will become apparent from the following description taken in conjunction with the following drawings.

BRIEF DESCRIPTION OF THE DRAWINGS

Embodiments are illustrated by way of example and not limitation in the figures of the accompanying drawings, in which like references indicate similar elements and in which:

FIG. 2A illustrates a scheme for mapping SDM data to transition binary codes, according to an example embodiment.

FIG. 2B illustrates a scheme for mapping SDM data to non return to zero inverted (NRZI) format codes, according to an example embodiment.

DETAILED DESCRIPTION

The following detailed description includes references to the accompanying drawings, which form a part of the detailed description. The drawings show illustrations in accordance with exemplary embodiments. These exemplary embodiments, which are also referred to herein as "examples," are described in enough detail to enable those skilled in the art to practice the present subject matter. The embodiments can be combined, other embodiments can be utilized, or structural, logical and electrical changes can be made without departing from the scope of what is claimed. The following detailed description is, therefore, not to be taken in a limiting sense, and the scope is defined by the appended claims and their equivalents.

The technologies disclosed herein provide for reducing a transition rate while transmitting data between Digital and Analog chips in order to save power consumed by I/O operations. Embodiments described herein may be practiced on any device that is configured to receive and/or provide audio or other signals such as, but not limited to, personal computers (PCs), tablet computers, mobile devices, smartphones, cellular phones, phone handsets, headsets, media devices, and systems for teleconferencing applications.

According to various embodiments of the present disclosure, a method for reducing a transition rate in transmitting data between digital and analog chips may include receiving, by an interface, the data from a first chip. The method may then proceed with mapping, by the interface, the data to transition binary code. The transition binary code includes series of '0' and '1', wherein a number of transitions from '0' to '1' and from '1' to '0' depends on a probability of a value of the received data. The method may further include (serially) transmitting, by the interface, the transition binary code to a second chip.

Figure 1:
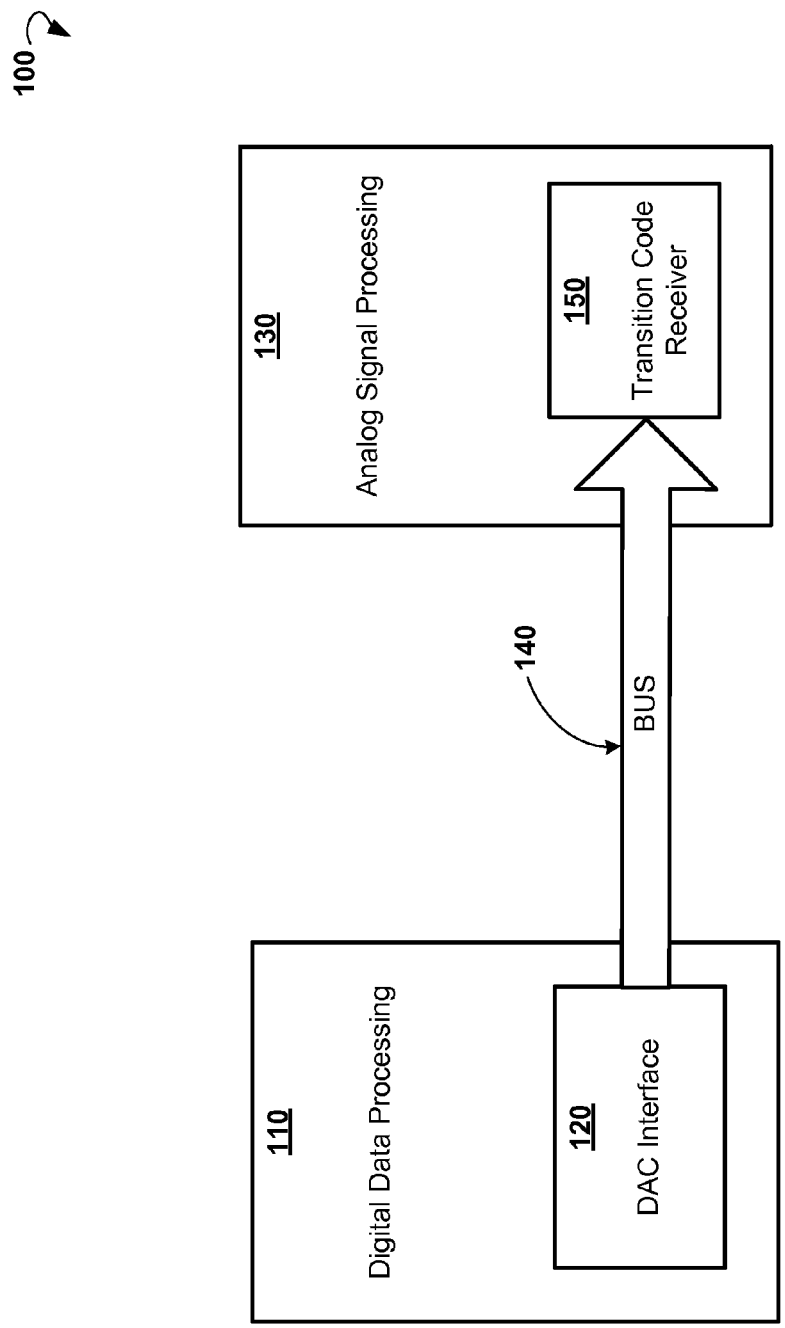
FIG. 1 illustrates a system suitable for implementation of methods for reducing a transition rate for N-bit SDM data, according to an example embodiment.

Referring now to the drawings, FIG. 1 shows a system 100 suitable for implementing methods for reducing a transition rate, according to an example embodiment. The system 100 may include a digital data processing unit 110, an Analog Signal Processing unit 130, a bus 140, a DAC interface unit 120 located at the Digital Data Processing unit 110, and a Transition Code Receiver 150 located at the Analog Signal Processing unit 130.

FIG. 2A illustrates mapping of N-bit SDM data according to an example embodiment, where N=5. SDM data in the left column in FIG. 2A is grouped in order from the most to less commonly used in coding audio signals. The corresponding N-bit transition binary codes are located in the right column in FIG. 2A.

For N-bit SDM, the coding scheme preferably allocates the code on all N bits being '0' for the most common value, which is typically an SDM value of zero. For the next most common SDM values, which are typically positive and negative SDM values of lowest magnitude, the coding scheme preferably allocates codes beginning or ending with a '1', and having only one segment of one or more consecutive '1' bits. Because there is a correlation between successive SDM values of low magnitude in which it is higher probability that a positive value is followed by a negative value and vice versa, negative values should begin with the same polarity (either '1' or '0'), and positive values with the opposite polarity as shown. For the next most common SDM values, typically of next higher magnitude, the scheme allocates codes beginning and ending with a '0' and having only one segment of one or more consecutive '1' bits. The next most common SDM values would have two segments of one or more consecutive '1' bits, and so forth. Such a coding scheme requires the fewest number of transitions to be carried out when typical SDM audio data is transmitted serially by DAC interface unit 120. The optimum scheme may vary depending on the details of the SDM design, and an examination of the statistics of actual outputs for typical audio signals may be used to guide the choice of the coding scheme. Also, if successive SDM samples are from distinct, uncorrelated channels, then the beginning and ending bit values are moot.

In an example of 5-bit coding scheme, value 0 would be coded '00000' (zero transitions), values −4 through −1 and +1 through +4 coded among '10000', '11000', '11100', '11110', '01111', '00111', '00011' and '00001' (one transition), values −10 through −5 and +5 through +10 coded among '01000', '01100', '01110', '00110', '00010', '00100', '10111', '10011', '10001', '11001', '11101', '11011' (two transitions), values −14 through −11 and +11 through +14 coded among '10010', '10100', '10110', '11010', '01001', '01011', '01101', and '00101' (three transitions), with −15 and +15 coded among '01010' and '10101' (four transitions).

In some embodiments, one particular N-bit SDM code, for example the code containing all non-zero bits ('11111') may be reserved for transmitting a command corresponding to a special purpose like, for example, synchronization of data. The choice of the code selected for this purpose may depend on the particular special purpose and the frequency of use of the code.

FIG. 2B illustrates a scheme for mapping of N-bit SDM data, where N=5, according to another example embodiment. In example mapping scheme of FIG. 2B, the data is transmitted using non return to zero inverted (NRZI) coding, in which any transition (either 0 to 1 or 1 to 0) indicates a '1' bit and no transition indicates a '0' bit. SDM data in left column, labeled "SDM code", in FIG. 2B is grouped in order from the most to less commonly used in coding audio signals. The corresponding N-bit transition binary codes are located in the "Transmitted Code" column in FIG. 2B. The actual NRZI transmitted streams (depending on whether the previous signal state was a 0 or a 1) are located in the two columns, identified as "Transmitted NRZI Streams" in FIG. 2B.

In example FIG. 2B, for N-bit SDM data, the coding scheme ideally allocates a code on all N bits as '0' for the most common value, which will typically be an SDM value of zero. For the next most common SDM values, which will typically be positive and negative SDM values of lowest magnitude, the coding scheme ideally allocates codes containing a single '1' bit. For the next most common SDM values, typically of the next higher magnitude, the scheme allocates codes having two '1' bits. The next most common SDM values would include three '1' bits, and so forth. Such a coding scheme will require the fewest number of transitions to be carried out when the data is transmitted serially by DAC interface unit 120. Note that in this embodiment, the use of NRZI makes any correlation between adjacent samples moot.

In an example of 5-bit coding scheme of FIG. 2B, value 0 would be coded '00000' (zero transitions); values −2 through −1 and +1 through +3 coded among '10000', '01000', '00100', '00010', '00001' (one transition); values −3 through −7 and +4 through +8 coded among '00011', '00101', '01001', '10001', '00110', '01010', '10010', '01100', '10100' and '11000' (two transitions); values −12 through −8 and +9 through +13 coded among '00111', '01011', '10011', '01101', '10101', '11001', '01110', '10110', '11010' and '11100' (three transitions); values −15 through −13 and +14 through +15 as '01111', '10111', '11011', '11101', and '11110' (four transitions); with the code of 11111 (five transitions) unused. In certain embodiments, the unused code may be reserved for transmitting a command corresponding to a special purpose such as, for example, synchronization of data. The choice of the code selected for this purpose may depend on the particular special purpose and the frequency of use of the code.

Figure 3A:
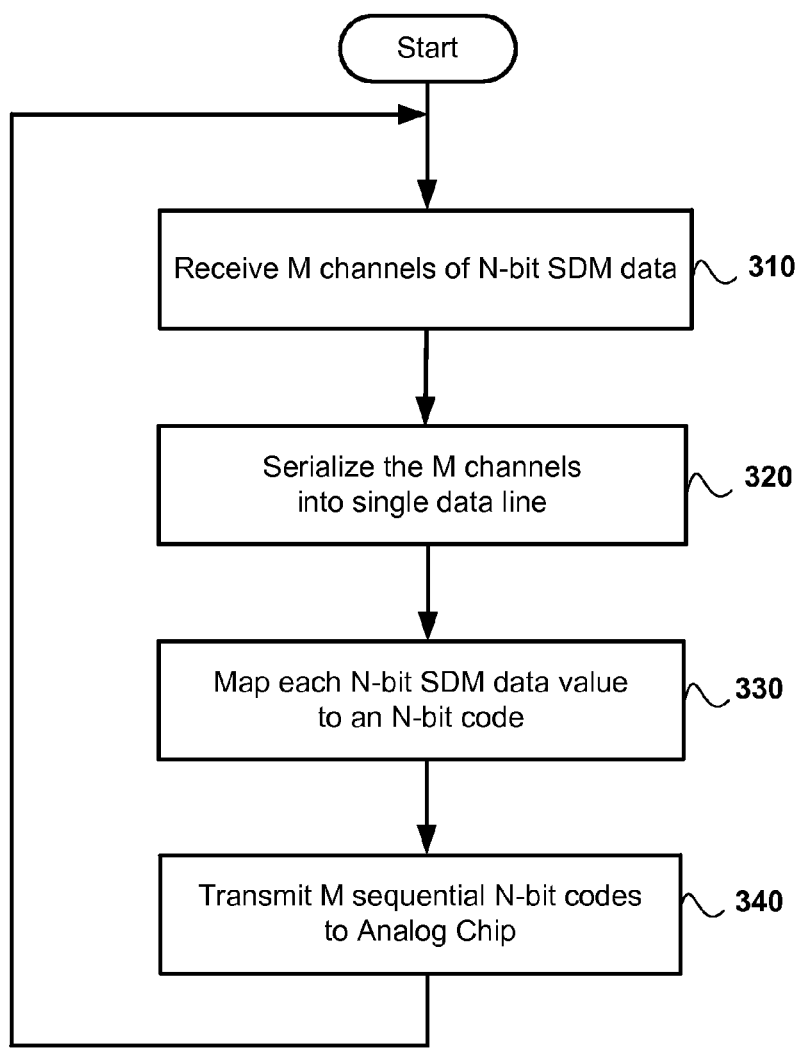
FIG. 3A is a flow chart diagram of a method for reducing a transition rate for transmitting N-bit SDM data between digital and analog chips, in accordance with some example embodiments.

FIG. 3A is a flow chart diagram of a method for reducing a transition rate in transmitting M channel, N-bit SDM data between a digital and an analog chips, in accordance with some embodiments. The method 300 may be performed by system 100 of FIG. 1. The method 300 may commence with receiving M input channels of N-bit SDM data at operation 310. The M channel N-bit SDM signal may be received in Digital Data Processing unit 110. In some embodiments, the M channels of data may be serialized into a single signal line from M parallel channels of N-bit SDM data at operation 320. The serializing and mapping operations may be performed at DAC interface unit 120. The N-bit SDM data may be further mapped to N-bit data binary codes in accordance with the mapping scheme described in FIG. 2A or FIG. 2B. It should be noted that the sequence of steps 320 and 330 is arbitrary. The mapping step can be performed either before or after the serializing step, depending on the implementation. The N-bit data codes may be further transmitted at operation 340 to Analog Signal Processing unit 130 by carrying out corresponding transitions via bus 140.

Figure 3B:
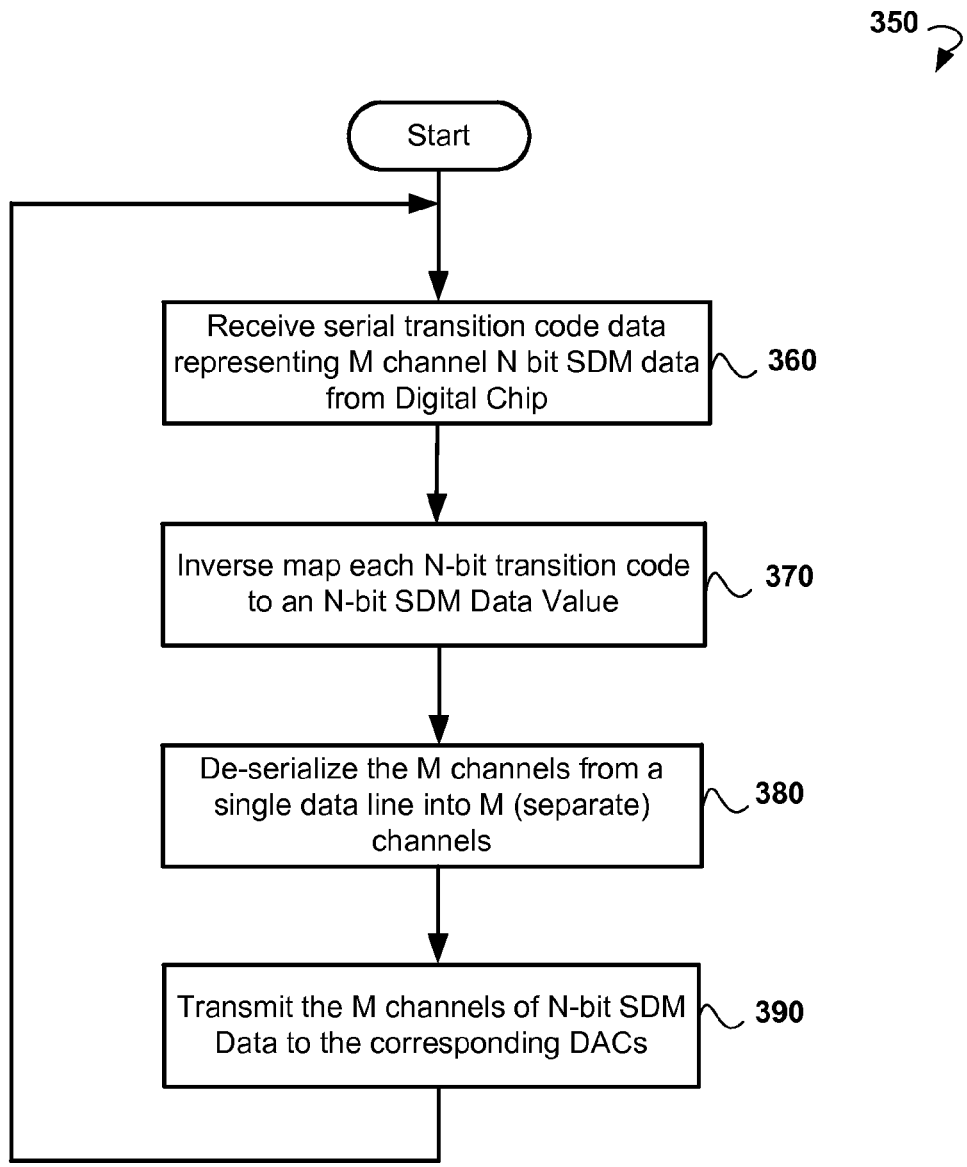
FIG. 3B is a flow chart diagram of a method for receiving a transition binary code, in accordance with some example embodiments.

FIG. 3B is a flow chart diagram of a method for receiving transition code data representing M channel, N-bit SDM data, in accordance with some embodiments. The method 350 may be performed by system 100 of FIG. 1. The method 350 may commence receiving at Analog Signal Processing unit 130 serial transition binary code data from bus 140 at operation 360. The N-bit binary data transition codes may be inversely mapped to N-bit SDM data at operation 360, in accordance with the inverse of the mapping scheme described in FIG. 2A or FIG. 2B. In some embodiments, the M channels of data may be de-serialized from a single signal line to M parallel channels of N-bit SDM data at operation 380. It should be noted that the sequence of steps 370 and 380 is arbitrary. The de-serializing and inverse mapping operations may be performed at Transition Code Receiver 150. The inverse mapping step can be performed either before or after the de-serializing step, depending on the implementation. The N-bit data codes may be further transmitted at operation 390 to DACs within the Analog Signal Processing unit 130.

Figure 4:
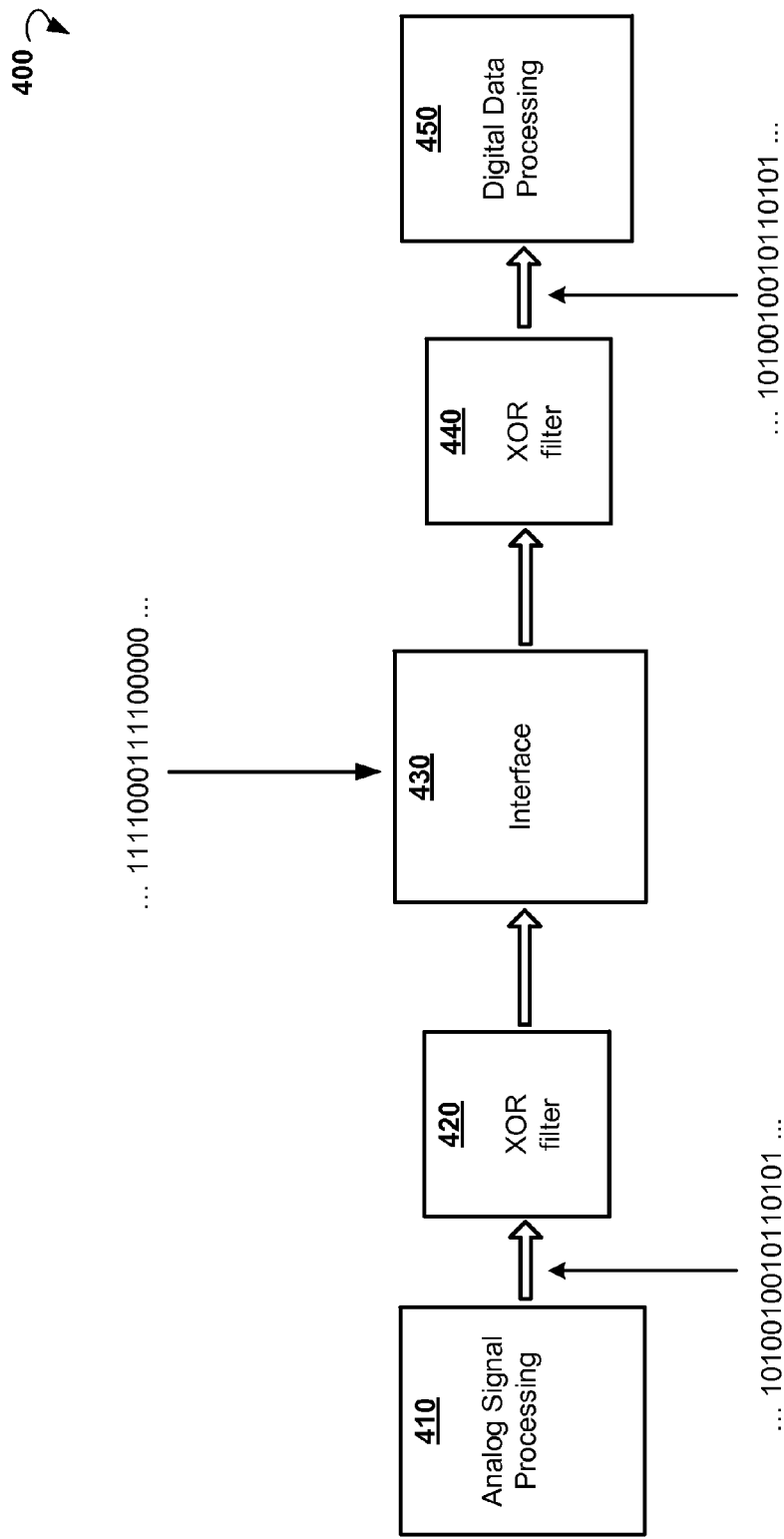
FIG. 4 illustrates a system suitable for implementation of methods for reducing a transition rate for serial PDM data, according to an example embodiment.

FIG. 4 illustrates a system suitable for implementation of methods for reducing a transition rate for serial PDM data, commonly used in ADCs, according to an example embodiment. The system 400 may include at least an analog signal processing unit 410, a first XOR filter unit 420, an interface unit 430, a second XOR filter unit 440, and digital data processing unit 450.

Figure 5:
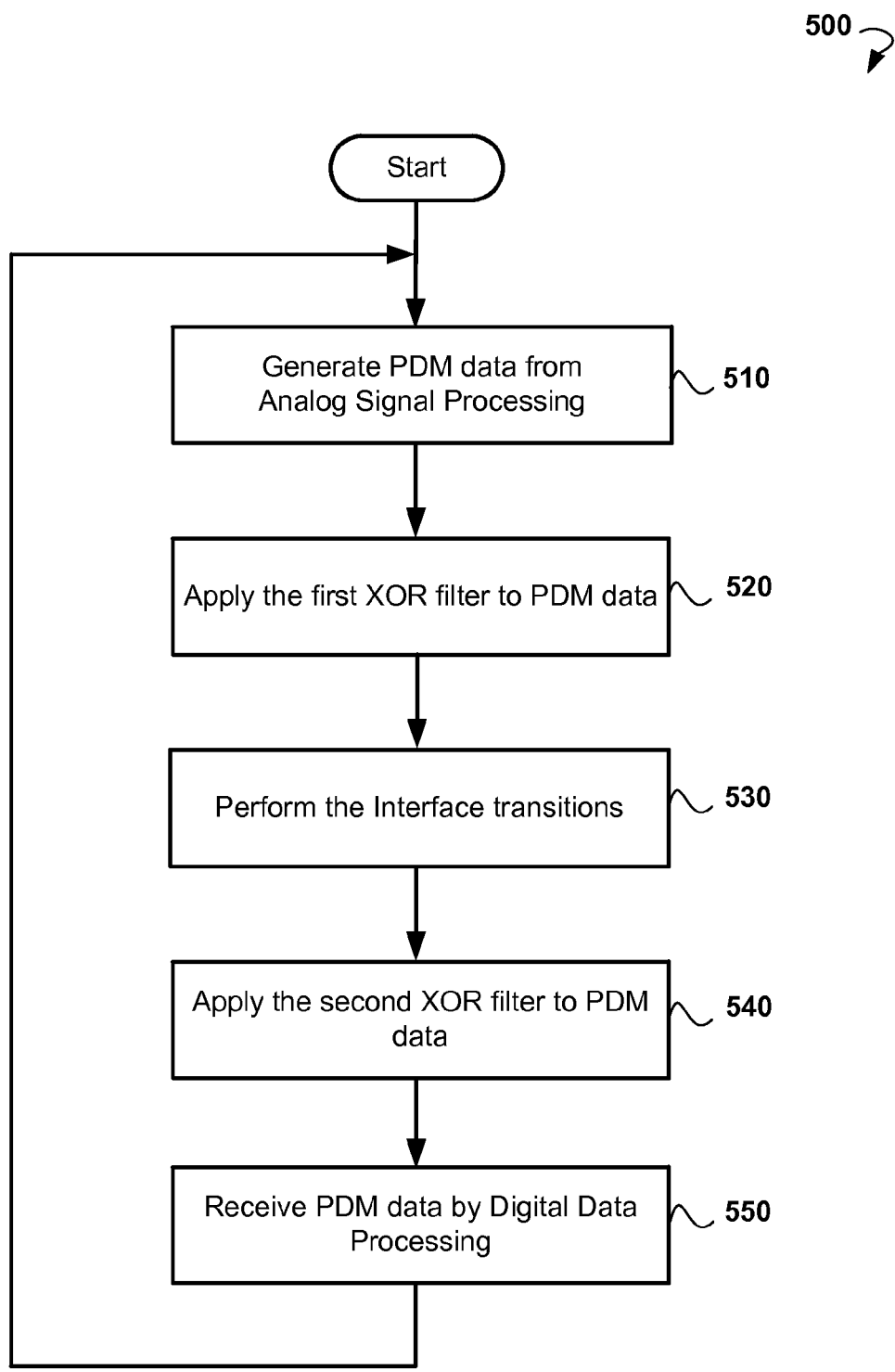
FIG. 5 is flow chart diagram of a method for reducing transition rate for transmitting serial PDM data between analog and digital chips, in accordance with some example embodiments.

FIG. 5 is flow chart diagram of a method for reducing transition rate in transmitting PDM data between analog and digital chips, in accordance with some example embodiments. The method 500 of FIG. 5 may be carried out by system 400. The method may commence with generating serial PDM data at operation 510 by analog signal processing unit 410. The XOR filter may be further applied to the PDM data at operation 520 by the first XOR filter unit 420. The PDM data may be further serially transmitted to second XOR filter unit 440 at operation 530 by performing transitions via interface unit 430.

By applying the first XOR filter unit 420, the PDM data is inversed insofar as for every alternate bit, a 0 bit may be replaced by 1 and vice versa (each 1 bit may be replaced with 0). Since the PDM data is noise-shaped, for low level audio signals, when a given bit is a 0, it is 3 times more likely to be followed by a 1 bit than a 0 bit, and vice versa. By complementing every alternate data bit, the number of transitions (from 0 to 1, or 1 to 0) in the inversed PDM data is significantly reduced, so that the number of transitions needed to be carried out by interface unit 430 may be reduced.

The PDM data may be complementarily inversed by the second XOR filter unit 440 at operation 540, restoring the original PDM sequence. The inversed PDM data may be further received by digital data processing unit 450 at operation 550. According to various embodiments, in order for the PDM data to restore the original PDM sequence without signal inversion, the first and second XOR filter units must operate in synchronism. This may be simply accomplished by starting both units in the same state (such that, for example, the first bit in the PDM stream is not inverted in both cases). Some more robust embodiments may re-synchronize the state of the first and second XOR units at various points in time during a transmitted stream.

Figure 6:
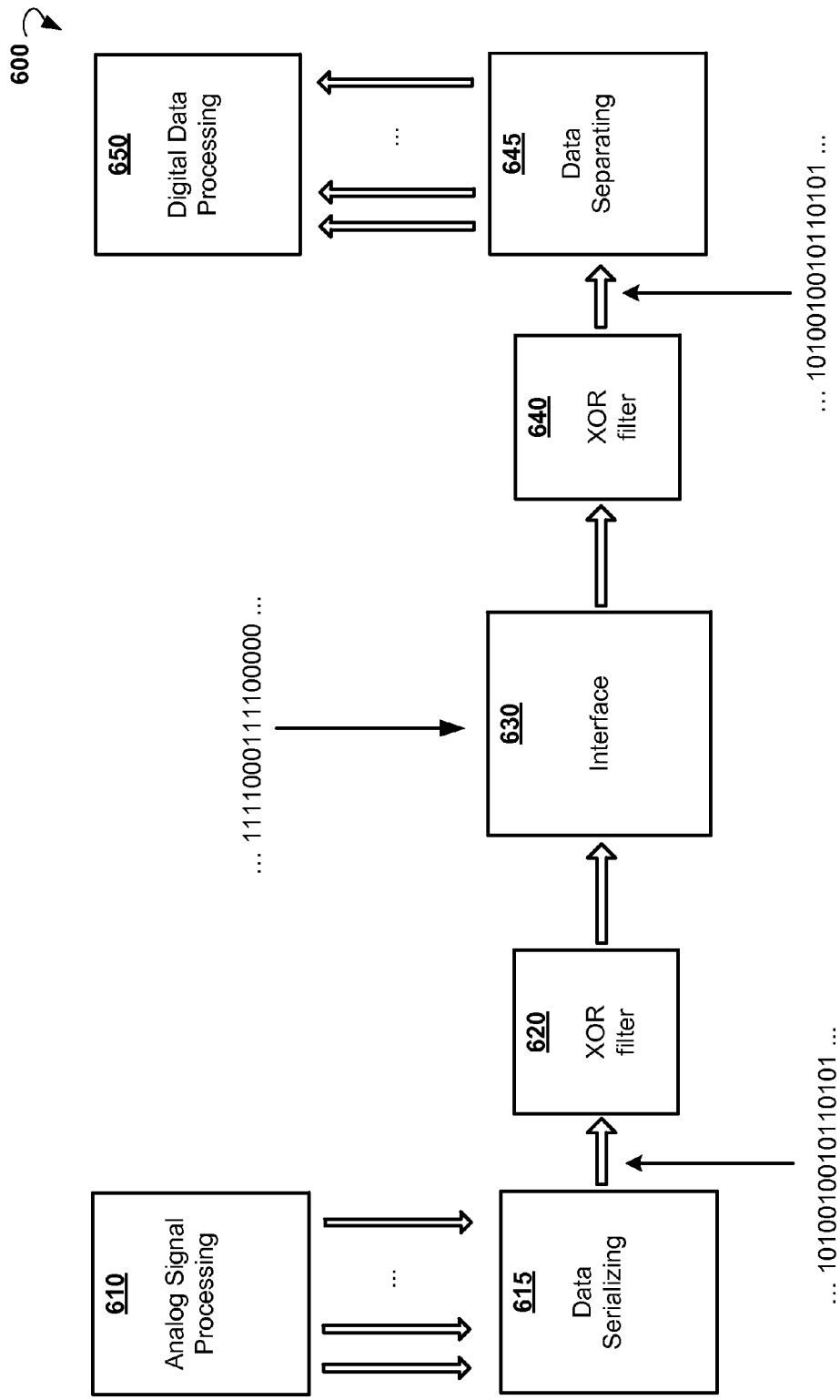
FIG. 6 illustrates a system suitable for implementation of methods for reducing a transition rate for multi-channel PDM data, according to an example embodiment.

FIG. 6 illustrates a system suitable for implementation of methods for reducing a transition rate for parallel multi-channel PDM data, commonly used in ADCs, according to another example embodiment. The system 600 may include at least an Analog Signal Processing unit 610, a Data Serializing unit 615, a first XOR filter unit 620, an interface unit 630, a second XOR filter unit 640, a Data Separating unit 645, and a digital data processing unit 650.

Figure 7:
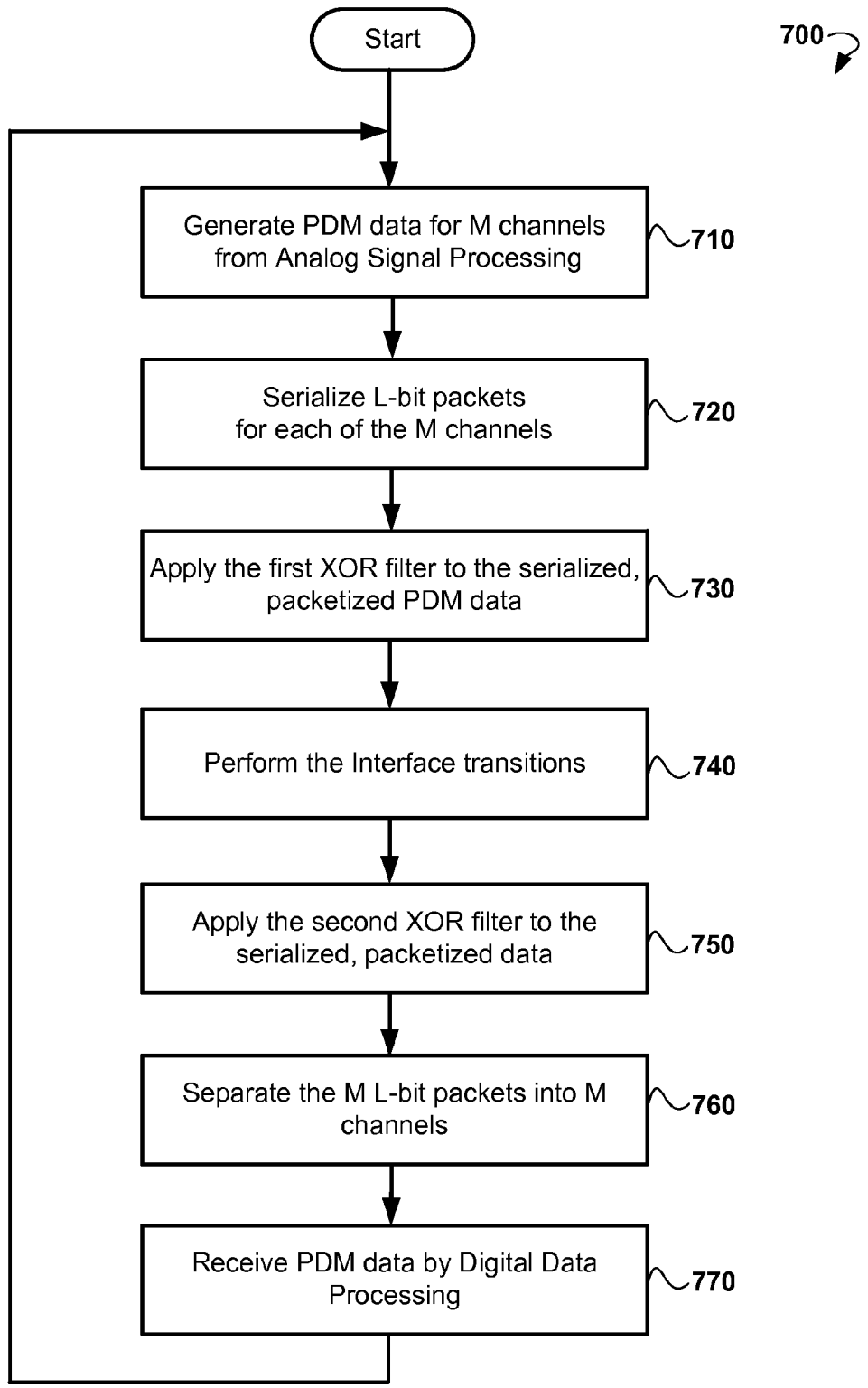
FIG. 7 is flow chart diagram of a method for reducing transition of transmitting multi-channel PDM data between analog and digital chips, in accordance with some example embodiments.

FIG. 7 is a flow chart diagram of a method for reducing a transition rate for transmitting M channels of PDM data between a digital and an analog chip, in accordance with some embodiments. The method 700 may be performed by system 600 of FIG. 6. The method 700 may commence with receiving M input channels of PDM data at operation 710. The M channel PDM signal may be generated in Analog Signal Processing unit 610. In some embodiments, the M channels of data may be grouped into L-bit packets, one packet for each of the M parallel channels at operation 720, and subsequently re-serialized. The packetizing and serializing operations may be performed by Data Serializing unit 615. The XOR filter may be further applied to the PDM data at operation 730 by the first XOR filter unit 620. The PDM data may be further serially transmitted to second XOR filter unit 640 at operation 740 by performing transitions via interface unit 630.

The PDM signals may be grouped into L-bit packets by a channel so that the correlation between adjacent serial bits is maintained within the packet, which maintains the effectiveness of the XOR filter in reducing the number of transitions. For larger values of L, the effectiveness of this process asymptotically approaches the factor of 3 reduction in power available in the single channel case. However, a larger packet size will increase the latency associated with packetizing. A good compromise between latency and power savings in a typical system may be L=8.

The PDM data may be complementarily inversed by the second XOR filter unit 640 at operation 750, thereby restoring the original packetized PDM sequence. The inversed PDM data may be separated by packet into the M individual PDM channels at operation 760 by Data Separating unit 645, and further received by digital data processing unit 650 at operation 770.

Figure 8:
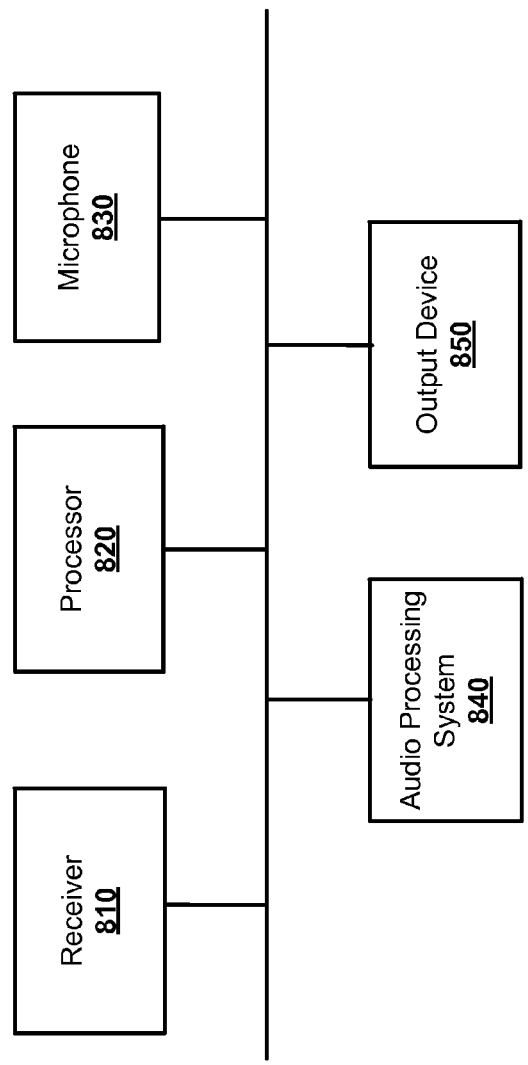
FIG. 8 shows an example system suitable for implementing methods for SDM encoding, in accordance with some example embodiments.

FIG. 8 shows a system 800 suitable for implementing methods for reducing transition rates in transmitting data between analog and digital chips, according to various example embodiments. The example system 800 may include a receiver 810, a processor 820, a microphone 830, an audio processing system 840, and an output device 850. The system 800 may comprise more or other components to provide a particular operation or functionality. Similarly, the system 800 may comprise fewer components that perform similar or equivalent functions to those depicted in FIG. 8.

The receiver 810 can be configured to communicate with a network such as the Internet, Wide Area Network (WAN), Local Area Network (LAN), cellular network, and so forth, to receive audio data stream. The received audio data stream may be then forwarded to the audio processing system 840 and the output device 850.

The processor 820 may include hardware and software that implement the processing of audio data and various other operations depending on a type of the system 800 (e.g., communication device and computer). A memory (e.g., non-transitory computer readable storage medium) may store, at least in part, instructions and data for execution by processor 820.

The audio processing system 840 may include hardware and software that implement the encoding of SDM data, according to various embodiments disclosed herein. The audio processing system 840 is further configured to receive acoustic signals from an acoustic source via microphone 830 (which may be one or more microphones or acoustic sensors) and process the acoustic signals. After reception by the microphone 830, the acoustic signals may be converted into electric signals by an analog-to-digital converter.

The output device 850 is any device which provides an audio output to a listener or another acoustically coupled device (e.g., the acoustic source). For example, the output device 850 may comprise a speaker, a class-D output, an earpiece of a headset, or a handset on the system 800.

Figure 9:
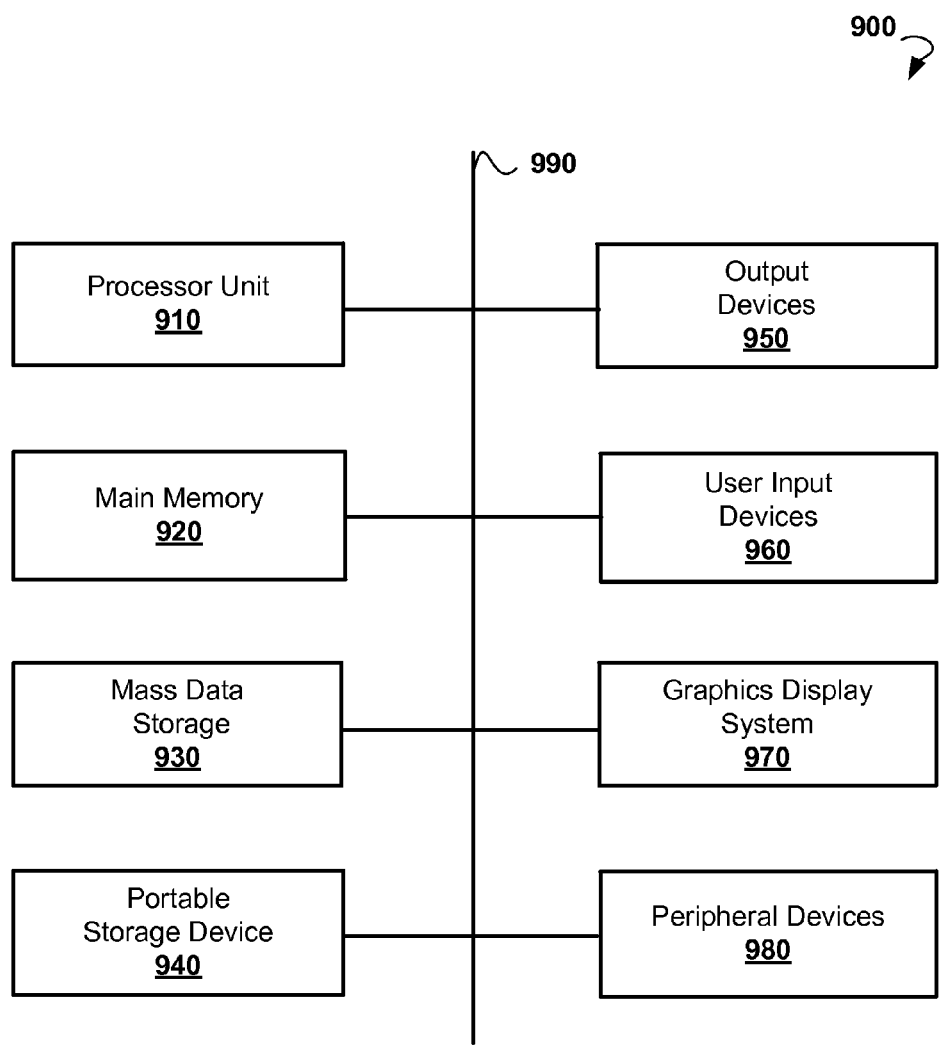
FIG. 9 illustrates an example computer system that may be used to implement embodiments of the present disclosure.

FIG. 9 illustrates an exemplary computer system 900 that may be used to implement some embodiments of the present disclosure. The computer system 900 of FIG. 9 may be implemented in the contexts of the likes of computing systems, networks, servers, or combinations thereof. The computer system 900 of FIG. 9 includes one or more processor units 910 and main memory 920. Main memory 920 stores, in part, instructions and data for execution by processor units 910. Main memory 920 stores the executable code when in operation, in this example. The computer system 900 of FIG. 9 further includes a mass data storage 930, portable storage device 940, output devices 950, user input devices 960, a graphics display system 970, and peripheral devices 980.

The components shown in FIG. 9 are depicted as being connected via a single bus 990. The components may be connected through one or more data transport means. Processor unit 910 and main memory 920 is connected via a local microprocessor bus, and the mass data storage 930, peripheral device(s) 980, portable storage device 940, and graphics display system 970 are connected via one or more input/output (I/O) buses.

Mass data storage 930, which can be implemented with a magnetic disk drive, solid state drive, or an optical disk drive, is a non-volatile storage device for storing data and instructions for use by processor unit 910. Mass data storage 930 stores the system software for implementing embodiments of the present disclosure for purposes of loading that software into main memory 920.

Portable storage device 940 operates in conjunction with a portable non-volatile storage medium, such as a flash drive, floppy disk, compact disk, digital video disc, or Universal Serial Bus (USB) storage device, to input and output data and code to and from the computer system 900 of FIG. 9. The system software for implementing embodiments of the present disclosure is stored on such a portable medium and input to the computer system 900 via the portable storage device 940.

User input devices 960 can provide a portion of a user interface. User input devices 960 may include one or more microphones, an alphanumeric keypad, such as a keyboard, for inputting alphanumeric and other information, or a pointing device, such as a mouse, a trackball, stylus, or cursor direction keys. User input devices 960 can also include a touchscreen. Additionally, the computer system 900 as shown in FIG. 9 includes output devices 950. Suitable output devices 950 include speakers, printers, network interfaces, and monitors.

Graphics display system 970 include a liquid crystal display (LCD) or other suitable display device. Graphics display system 970 is configurable to receive textual and graphical information and processes the information for output to the display device.

Peripheral devices 980 may include any type of computer support device to add additional functionality to the computer system.

The components provided in the computer system 900 of FIG. 9 are those typically found in computer systems that may be suitable for use with embodiments of the present disclosure and are intended to represent a broad category of such computer components that are well known in the art. Thus, the computer system 900 of FIG. 9 can be a personal computer (PC), hand held computer system, telephone, mobile computer system, workstation, tablet, phablet, mobile phone, server, minicomputer, mainframe computer, wearable, or any other computer system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, TIZEN and other suitable operating systems.

The processing for various embodiments may be implemented in software that is cloud-based. In some embodiments, the computer system 900 is implemented as a cloud-based computing environment, such as a virtual machine operating within a computing cloud. In other embodiments, the computer system 900 may itself include a cloud-based computing environment, where the functionalities of the computer system 900 are executed in a distributed fashion. Thus, the computer system 900, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources.

The cloud may be formed, for example, by a network of web servers that comprise a plurality of computing devices, such as the computer system 900, with each server (or at least a plurality thereof) providing processor and/or storage resources. These servers may manage workloads provided by multiple users (e.g., cloud resource customers or other users). Typically, each user places workload demands upon the cloud that vary in real-time, sometimes dramatically. The nature and extent of these variations typically depends on the type of business associated with the user.

The present technology is described above with reference to example embodiments. Therefore, other variations upon the example embodiments are intended to be covered by the present disclosure.

What is claimed is:

1. A method for reducing a transition rate in transmitting data between digital and analog chips, the method comprising:
    receiving, by an interface, data from a data source on a first chip;
    mapping, by the interface, the data to a transition binary code, the transition binary code comprising a series of 0s and 1s, wherein a number of transitions from a 0 to 1 and from 1 to 0 depends on a probability of a value of the data;
    applying an XOR filter to every other bit of the data while mapping the data to the transition binary codes;
    transmitting, by the interface, the transition binary code to a second chip; and
    applying an XOR filter to every other bit of the transition binary code after transmitting to the second chip.

2. The method of claim 1, wherein the data represents an audio data stream.

3. The method of claim 1, wherein the data includes sigma-delta modulator binary data.

4. The method of claim 1, wherein the transition binary code representing the data having a more probable value includes fewer transitions from 0 and 1 and from 1 to 0 than the transition binary code representing the data having a less probable value.

5. The method of claim 1, wherein the transition binary code is a non-return-to-zero inverted format code.

6. The method of claim 1, wherein the data is received by packets from multiple parallel channels.

7. The method of claim 6, further comprising:
    serializing, by the interface, the packets to serial data before mapping to the transition binary code; and
    parallelizing, by the interface, the transition binary code to further packets after transmitting to the second chip.

8. The method of claim 6, further comprising:
    serializing, by the interface, the packets to serial data after mapping to the transition binary code; and
    parallelizing, by the interface, the transition binary code to further packets after transmitting to the second chip.

9. The method of claim 1, wherein the data includes pulse-density modulation binary data.

10. The method of claim 1, wherein a length of the series of the transition binary code is 5 bits.

11. A system for reducing a transition rate in transmitting data between digital and analog chips, the system comprising:
    an interface configured to:
        receive data from a data source on a first chip;
        map the data to a transition binary code, the transition binary code comprising a series of 0s and 1s, wherein a number of transitions from 0 to 1 and from 1 to 0 depends on a probability of a value of the data;
        apply an XOR filter to every other bit of the data while mapping the data to the transition binary code; and
        transmit the transition binary code to a second chip, the second chip being configured to apply an XOR filter to every other bit of the transition binary code after receiving the transition binary code from the interface.

12. The system of claim 11, wherein the data represents an audio data stream.

13. The system of claim 11, wherein the data includes sigma-delta modulator binary data.

14. The system of claim 11, wherein the transition binary code representing the data having a more probable value contains less transitions from 0 and 1 and from 1 to 0 than the transition binary code representing the data having a less probable value.

15. The system of claim 11, wherein the transition binary code is a non-return-to-zero inverted format code.

16. The system of claim 11, wherein the data is received by packets from multiple parallel channels.

17. The system of claim 16, wherein the interface is further configured to:
  serialize the packets to the data before mapping to the transition binary code; and
  parallelize the transition binary code to further packets while transmitting to the second chip.

18. The system of claim 11, wherein the data includes a pulse-density modulation binary data.

19. A non-transitory processor-readable medium having embodied thereon a program being executable by at least one processor to perform a method for reducing a transition rate in transmitting data between digital and analog chips, the method comprising:
  receiving data from a data source on a first chip;
  mapping the data to a transition binary code, the transition binary code comprising a series of 0s and 1s, wherein a number of transitions from 0 to 1 and from 1 to 0 depends on a probability of a value of the data;
  applying an XOR filter to every other bit of the data while mapping the data to the transition binary codes;
  transmitting the transition binary code to a second chip; and
  applying an XOR filter to every other bit of the transition binary code after transmitting to the second chip.

20. The non-transitory processor-readable medium of claim 19, wherein the data represents an audio data stream.

21. The non-transitory processor-readable medium of claim 19, wherein the data includes at least one of sigma-delta modulator binary data and pulse-density modulation binary data.

* * * * *